United States Patent [19]

Rha et al.

[11] Patent Number: 5,459,088

[45] Date of Patent: Oct. 17, 1995

[54] METHOD FOR MAKING A THIN FILM TRANSISTOR

[75] Inventors: Sa K. Rha, Seoul; Youngil Cheon, Nowon-gu, both of Rep. of Korea

[73] Assignee: Goldstar Electron Co., Ltd., Cheongju, Rep. of Korea

[21] Appl. No.: 287,750

[22] Filed: Aug. 9, 1994

[30] Foreign Application Priority Data

Aug. 9, 1993 [KR] Rep. of Korea .................. 15378/1993

[51] Int. Cl.$^6$ .................................................. H01L 29/786
[52] U.S. Cl. .............................. 437/40; 437/43; 437/46; 437/48; 437/52
[58] Field of Search .................................... 437/915, 977, 437/40, 43, 45, 48, 52

[56] References Cited

U.S. PATENT DOCUMENTS

| | | | |
|---|---|---|---|
| 4,735,919 | 4/1988 | Faraone | 437/69 |
| 4,774,202 | 9/1988 | Pan et al. | 437/43 |
| 5,149,676 | 9/1992 | Kim et al. | 437/977 |
| 5,300,446 | 4/1994 | Fujioka | 437/915 |

OTHER PUBLICATIONS

16Mbit SRAM Cell Technologies for 2.0V Operation; H. Ohkubo, et al.; 1991 IEEE; pp. 481–484IDEM.

Primary Examiner—Brian E. Hearn
Assistant Examiner—Tuan Nguyen
Attorney, Agent, or Firm—Alan R. Loudermilk

[57] ABSTRACT

A method for making semiconductor thin film transistors (TFTs) having a bottom gate such that the gate electrode is formed of a polysilicon layer with a rugged surface, thereby providing a TFT which has a high on/off current ratio. According to the present invention, a thin film transistor may have a substrate; a gate electrode having a rugged surface formed on the substrate; a gate insulating layer formed on the gate electrode and the substrate; a semiconductor layer formed over the gate insulation layer; impurity regions formed at opposite sides of the gate electrode in the semiconductor layer. A method for making a thin film transistor according to present invention may include the steps of: forming a gate electrode having a rugged surface on a substrate; forming an insulating layer and a semiconductor layer on the substrate and the gate electrode; forming impurity regions at opposite sides of the gate electrode in the semiconductor layer.

11 Claims, 2 Drawing Sheets

5,459,088

METHOD FOR MAKING A THIN FILM TRANSISTOR

BACKGROUND OF THE INVENTION

The present invention relates to methods for making thin film transistors (TFTs), and more particularly to methods for making TFTs of a type having a bottom gate.

Generally, TFTs are widely used in static random access memories (SRAMs) or in livid crystal displays (LCDs) as a load device instead of a load resistor.

Modern technology produces mega-bit-sized static random access memories with reduced cell size and low supply voltage (Vcc), and thus such SRAMs use polysilicon TFTs as loads instead of polysilicon resistors in order to obtain high charging current and low leakage current for the SRAM cell. Therefore it is desirable for the TFT to have high on current and low off current. However, the ratio of on/off current of polysilicon TFTs typically is not high enough to satisfy cell operation stability, which is lowered due to the cell size reduction and lowering of the power supply voltage. If cell size is decreasing, then off current is increasing due to short channel effects, but on current is not increasing, and thus the ratio of on/off current is lowered.

An attempt that has been made to solve this problem for megabit SRAMs is disclosed in the paper "16 Mbit SRAM Cell Technologies for 2.0 V Operation" by H. Ohkubo et al., Technical Digest IEDM 1991, pages 481 to 483. In this paper, the key features of the disclosed technologies include: 1) a symmetrical cell configuration; 2) an access transistor with an N- offset resistor; 3) a ground plate expanded on the cell area; and 4) a polysilicon TFT with an LDO (Lightly Doped Offset) structure, all of which utilize a Self Aligned Contact (SAC) process. The symmetrical cell configuration, the ground plate and the TFT with the LDO structure contribute to cell operation stability.

A conventional process for fabricating a polysilicon TFT of a bottom gate type with an LDO structure is depicted in FIG. 1.

As shown in FIG. 1A, insulating layer 12 is deposited on surface 11 where a TFT is to be formed, and a polysilicon layer is deposited on insulating layer 12. The polysilicon layer is etched to form gate electrode (gate line) 13 by a photolithography process. After this step, gate insulating layer (gate insulator) 14 is formed on gate electrode 13 and insulating layer 12 by a high temperature oxide deposition process. Body polysilicon 15 (or amorphous silicon) is deposited on gate insulator 14 and silicon ions are implanted in order to improve the electrical characteristics. Then, amorphous body silicon layer 15 is annealed for 5 hrs and more at 600°+/−50° C. After this, as illustrated implantation process 16 may be carried out for purposes of regulating the threshold voltage.

In the next step, as shown in FIG. 1B, the low concentration impurity region, LDO drain junction 19, is formed at one side of gate line in body polysilicon 15 by N− impurity ion implantation 18 with photoresist mask 17 serving to limit the drain zone for the Lightly Doped Drain (LDD) structure.

Next, as shown in FIG. 1C, highly doped drain and source regions are formed by implantation of N+ impurity ions 110 after patterning photoresist pattern 17' for protecting the LDD junction against the implantation using an offset S/D photoresist mask.

With this type of TFT, since body polysilicon layer 15 is formed on gate 13 and of an angular structural shape, a considerable amount of leakage current still occurs, and due to the gate electrode the step coverage is poor. Therefore, the on/off current ratio is still low, and a subsequent metallization process is not easy.

SUMMARY OF THE INVENTION

An object of the present invention is to provide a TFT which has a high on/off current ratio.

Another object of this invention is to decrease the off current of the thin film transistor even though the thin film transistor is of very small size.

According to the present invention, a thin film transistor comprises a substrate; a gate electrode having a rugged surface formed on the substrate; a gate insulating layer formed on the gate electrode and the substrate; a semiconductor layer formed over the gate insulation layer; impurity regions formed at opposite sides of the gate electrode in the semiconductor layer.

The substrate may be a silicon wafer, the gate electrode may be formed of polysilicon, the gate insulating layer may be formed of silicon oxide. One of the impurity regions has a low concentration impurity region between the impurity region and a channel of the thin film transistor. The impurity regions and the low concentration impurity region may be formed by a P type ion implantation.

A method for making a thin film transistor according to present invention comprises the steps of: forming a gate electrode having a rugged surface on a substrate; forming an insulating layer and a semiconductor layer on the substrate and the gate electrode; forming impurity regions at opposite sides of the gate electrode in the semiconductor layer.

The step for forming the impurity regions includes the steps of: forming a low concentration impurity region at one side of the gate electrode in the semiconductor layer; and forming a high concentration impurity region at opposite sides of the gate electrode in the semiconductor layer.

BRIEF DESCRIPTION OF THE DRAWINGS

The invention will now be described in detail with reference to the attached drawings, in which.

DETAILED DESCRIPTION OF THE PREFERRED EMBODIMENTS

The preferred embodiments of the present invention are explained with reference to FIG. 2.

Process steps for the production of a thin film transistor according to the present invention will now be explained.

Figure 1A:
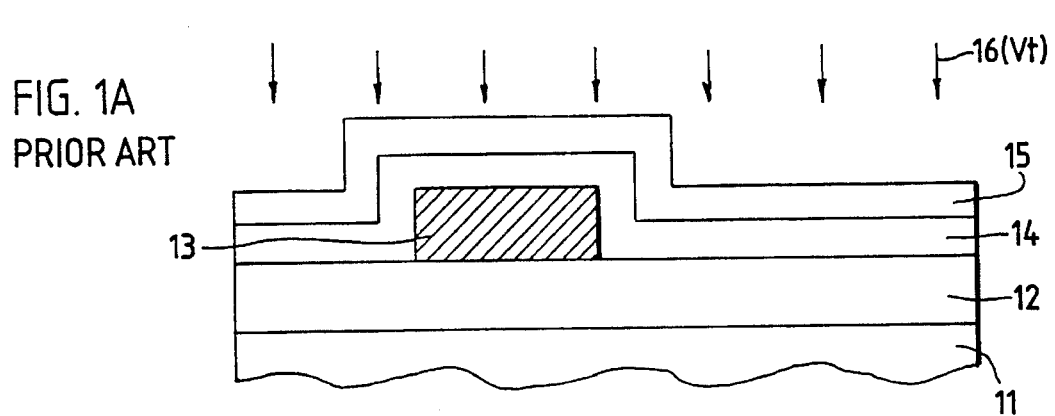
FIGS. 1A, 1B and 1C are sectional views of a portion of a semiconductor substrate and structures thereon illustrating processes in the production of a conventional thin film transistor.
Figure 1B:
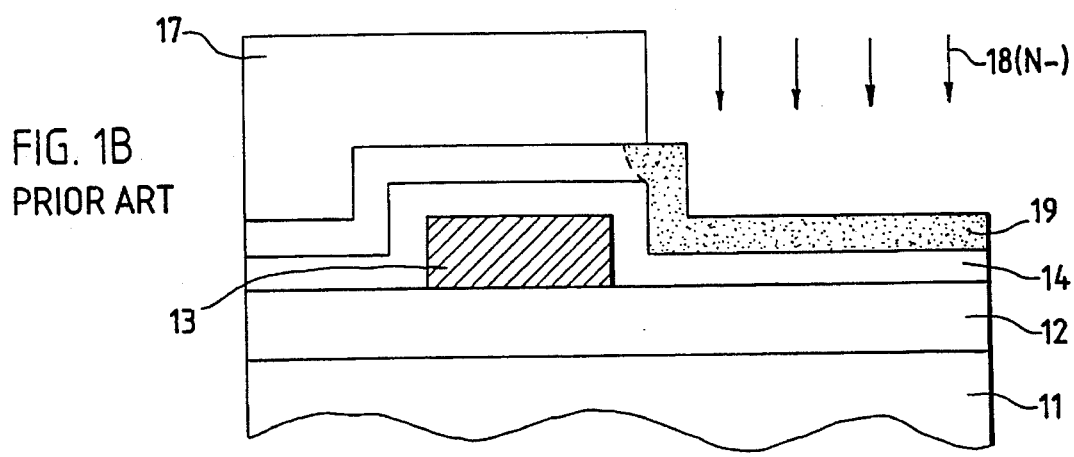
Figure 1C:
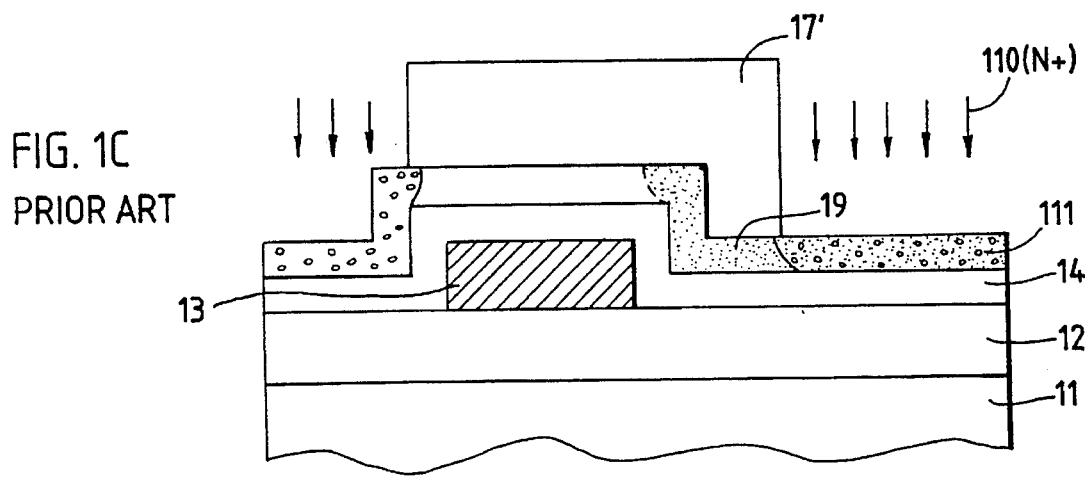
Figure 2A:
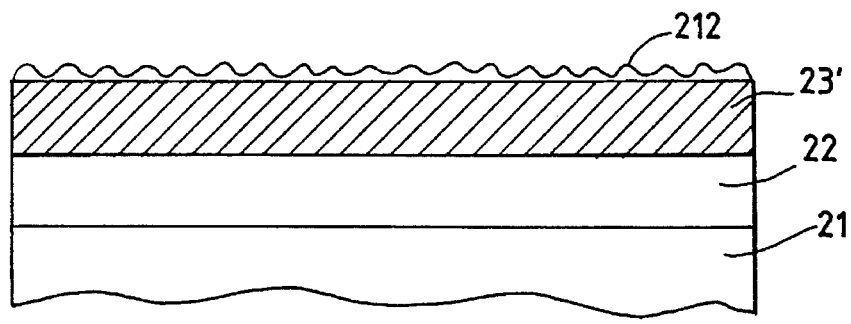
FIG. 2A, 2B, 2C and 2D are sectional views illustrating the processes of one embodiment of the present invention.

As illustrated in FIG. 2A, an oxide layer as insulating layer 22 is formed on substrate 21 to a thickness of 1000 Angstroms or more, and a polysilicon layer as conductive layer 23' is deposited on insulating layer 22. Substrate 21 may be a silicon substrate, where most components of an SRAM circuit, such as flip-flops, already have been formed.

Polysilicon layer 23' is formed such that: after in-situ doped polysilicon is deposited, hemispherical grain polysilicon layer 212 is formed on the in-situ doped polysilicon; after in-situ doped amorphus silicon is deposited, hemispherical grain polysilicon layer 212 is formed thereon; after undoped polysilicon or undoped amorphous silicon is deposited and doped by ion implantation or $POCl_3$ doping, hemispherical grain polysilicon layer 212 is formed thereon; or after in-situ doped polysilicon or in-situ doped amorphus silicon is deposited, hemispherical grain polysilicon layer 212 is formed in the same processing tube. Thus, polysilicon layer 23 has a hemispherical surface, or a rugged surface.

Figure 2B:
Figure 2B:
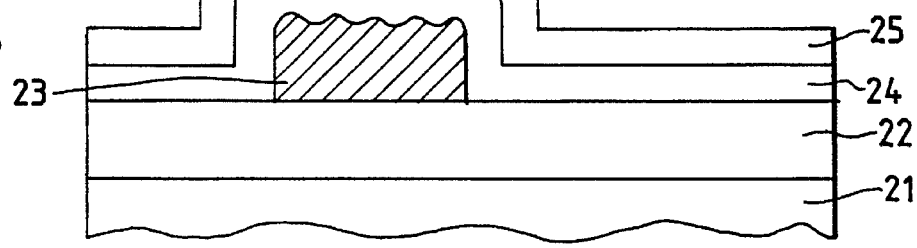

Next, as illustrated in FIG. 2B, gate line 23 (gate electrode) is formed by photo-masking with a gate line photo mask. After gate line 23 is formed, gate insulating layer 24 (gate insulator) is formed on gate line 23 and insulating layer 22, and semiconductor layer 25 is formed on gate insulating layer 24. Gate insulating layer 24 is formed of high temperature silicon oxide. Semiconductor layer 25 is formed of a polysilicon or amorphous polysilicon, and is referred to as body polysilicon. Into this body polysilicon Si ions are implanted in order to make the body polysilicon more amorphous. The silicon ion implantation also improves the characteristics of body polysilicon semiconductor layer 25. Semiconductor layer 25 becomes more amorphous due to the Si implantation and is annealed for about 5 hours or more at 600°+/−50° C. or by using a laser annealing method.

After this step, implantation process 26 for regulating the threshold voltage is carried out.

Figure 2C:
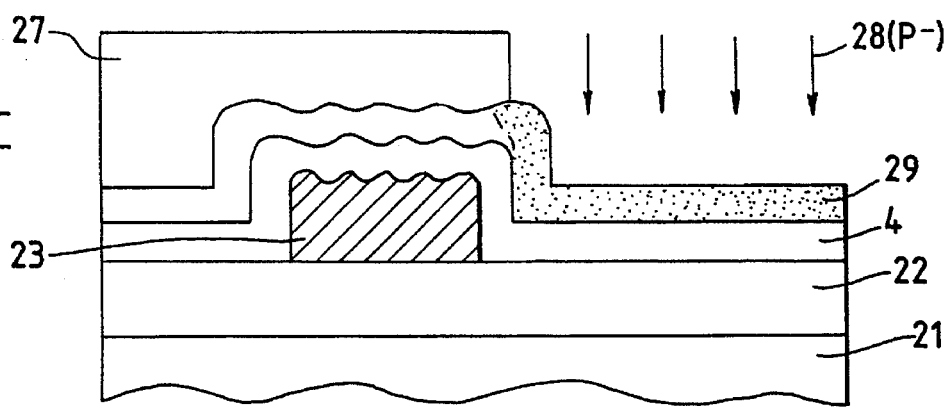

In the next step, as illustrated in FIG. 2C, after making photoresist mask 27, an LDD (lightly doped drain) junction 29 is formed in semiconductor layer 25 at one side of gate line 23 by $P^-$ ion implantation 28 using photoresist mask 27.

Figure 2D:
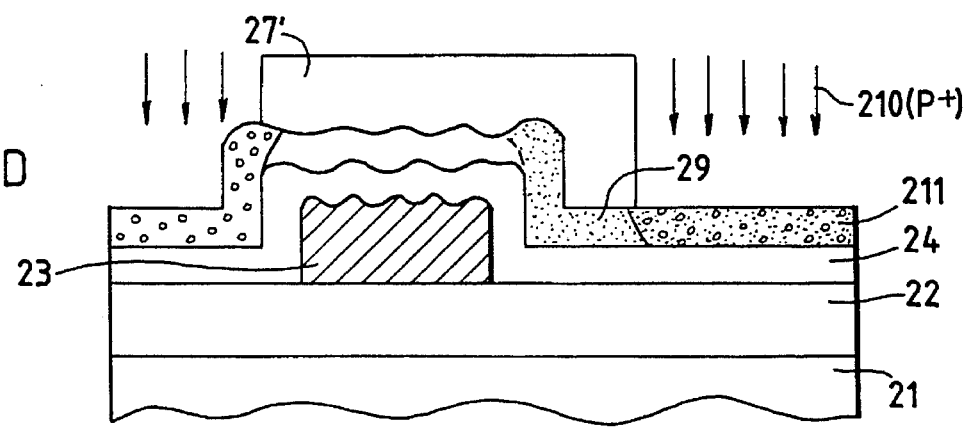

In the next step, as illustrated in FIG. 2D, after making off-set photo-resist mask 27', which covers a region for the Lightly Doped Drain (LDD), highly doped source/drain junction 211 is formed by $P^+$ ion implantation 210 with photo-resist mask 27' serving to protect the LDD junction against the implantation. Thereby, a TFT of a bottom gate type is formed.

As is apparent from the foregoing, the gate line having a rugged surface at a channel side makes the channel length longer. The channel length may be lengthened due to the rugged gate almost two times more than that of a flat gate. Accordingly, the off current of the TFT can be decreased. With this method, the short channel effect in the TFT can be overcome or reduced. Thus, a higher on/off current ratio may be obtained.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A method for making a thin film transistor comprising the steps of:

forming a gate electrode having a rugged surface on a substrate;

forming an insulating layer and a semiconductor layer on the substrate and the gate electrode;

forming an impurity region at opposite sides of the gate electrode in the semiconductor layer.

2. The method of claim 1, wherein the substrate comprises silicon, the gate electrode comprises polysilicon, and the gate insulating layer comprises silicon oxide.

3. The method of claim 1, wherein the gate electrode is formed by one of the following:

(a) formation of a doped polysilicon layer, and formation of a hemispherical grain polysilicon layer on the doped polysilicon layer;

(b) formation of a doped amorphous silicon layer, and formation of a hemispherical grain polysilicon layer on the doped amorphous silicon layer;

(c) formation of an undoped polysilicon layer or an undoped amorphous silicon layer, doping of the undoped polysilicon layer or undoped amorphous silicon layer by ion implantation or $POCl_3$ doping, and formation of a hemispherical grain polysilicon layer on the polysilicon layer or the amorphous silicon layer; or (d) formation of a doped polysilicon layer or a doped amorphous silicon layer and formation of a hemispherical grain polysilicon layer on the doped polysilicon layer or the doped amorphous silicon layer as part of the same processing.

4. The method of claim 1, wherein the step of forming the impurity regions includes the steps of: forming a low concentration impurity region at one side of the gate electrode in the semiconductor layer; and forming high concentration impurity regions at opposite sides of the gate electrode in the semiconductor layer.

5. The method of claim 4, wherein the impurity regions and the low concentration impurity region are formed by P type ion implantation.

6. A method for making a thin film transistor comprising the steps of:

forming an insulating layer on a substrate;

forming a conductive layer having a rugged surface on the insulating layer;

selectively etching the conductive layer to form a gate electrode on the insulating layer;

forming a gate insulating layer and a semiconductor layer on the gate electrode;

forming a low concentration impurity region at one side of the gate electrode in the semiconductor layer;

forming high concentration impurity regions at opposite sides of the gate electrode in the semiconductor layer.

7. The method of claim 6, wherein the conductive layer is formed by one of the following:

(a) formation of a doped polysilicon layer, and formation of a hemispherical grain polysilicon layer on the doped polysilicon layer;

(b) formation of a doped amorphous silicon layer, and formation of a hemispherical grain polysilicon layer on the doped amorphous silicon layer;

(c) formation of an undoped polysilicon layer or an undoped amorphous silicon layer, doping of the undoped polysilicon layer or undoped amorphous silicon layer by ion implantation or $POCl_3$ doping, and formation of a hemispherical grain polysilicon layer on the polysilicon layer or the amorphous silicon layer; or (d) formation of a doped polysilicon layer or a doped amorphous silicon layer and formation of a hemispherical grain polysilicon layer on the doped polysilicon layer or the doped amorphous silicon layer as part of the same processing.

8. A method for making a thin film transistor comprising the steps of:

forming an insulating layer on a substrate;

forming a conductive layer having a rugged surface on the insulating layer;

selectively etching the conductive layer to form a gate electrode on the insulating layer;

forming a gate insulating layer and a semiconductor layer on the gate electrode;

implanting semiconductor ions in the semiconductor layer;

forming a low concentration impurity region at one side of the gate electrode in the semiconductor layer;

forming high concentration impurity regions at opposite sides of the gate electrode in the semiconductor layer.

9. The method of claim 8, wherein the substrate comprises silicon, the conductive layer comprises polysilicon, and the gate insulating layer comprises silicon oxide.

10. The method of claim 8, wherein the impurity regions and the low concentration impurity region are formed by P type ion implantation.

11. The method of claim 8, wherein the conductive layer is formed by one of the following:

(a) formation of a doped polysilicon layer, and formation of a hemispherical grain polysilicon layer on the doped polysilicon layer;

(b) formation of a doped amorphous silicon layer, and formation of a hemispherical grain polysilicon layer on the doped amorphous silicon layer;

(c) formation of an undoped polysilicon layer or an undoped amorphous silicon layer, doping of the undoped polysilicon layer or undoped amorphous silicon layer by ion implantation or $POCl_3$ doping, and formation of a hemispherical grain polysilicon layer on the polysilicon layer or the amorphous silicon layer; or (d) formation of a doped polysilicon layer or a doped amorphous silicon layer and formation of a hemispherical grain polysilicon layer on the doped polysilicon layer or the doped amorphous silicon layer as part of the same processing.

* * * * *